(12) United States Patent
Cruz et al.

(10) Patent No.: US 8,058,107 B2
(45) Date of Patent: Nov. 15, 2011

(54) SEMICONDUCTOR DIE PACKAGE USING LEADFRAME AND CLIP AND METHOD OF MANUFACTURING

(76) Inventors: Erwin Victor R. Cruz, Koronadal (PH); Elsie Cabahug, Mandaue (PH); Ti Ching Shian, Penang (MY); Venkat Iyer, Cupertino, CA (US)

( * ) Notice: Subject to any disclaimer, the term of this patent is extended or adjusted under 35 U.S.C. 154(b) by 504 days.

(21) Appl. No.: 11/856,635

(22) Filed: Sep. 17, 2007

(65) Prior Publication Data

US 2008/0044946 A1 Feb. 21, 2008

Related U.S. Application Data

(62) Division of application No. 11/282,967, filed on Nov. 18, 2005, now Pat. No. 7,285,849.

(51) Int. Cl.
*H01L 21/00* (2006.01)
*H01L 23/495* (2006.01)

(52) U.S. Cl. .......... 438/123; 257/666; 257/667

(58) Field of Classification Search .......... 438/123; 257/666, 667
See application file for complete search history.

(56) References Cited

U.S. PATENT DOCUMENTS

| | | | |
|---|---|---|---|
| 5,001,545 A * | 3/1991 | Kalfus et al. ............ 257/773 |
| 6,040,626 A | 3/2000 | Cheah et al. | |
| 6,133,634 A | 10/2000 | Joshi | |
| 6,249,041 B1 | 6/2001 | Kasem et al. | |
| 6,307,755 B1 | 10/2001 | Williams et al. | |
| 6,319,755 B1 | 11/2001 | Mauri | |
| 6,391,687 B1 | 5/2002 | Cabahug et al. | |
| 6,396,127 B1 * | 5/2002 | Munoz et al. ............ 257/666 |
| 6,423,623 B1 | 7/2002 | Bencuya et al. | |
| 6,432,750 B2 | 8/2002 | Jeon | |
| 6,459,147 B1 | 10/2002 | Crowley et al. | |
| 6,465,276 B2 | 10/2002 | Kuo | |
| 6,469,384 B2 | 10/2002 | Joshi | |
| 6,489,678 B1 | 12/2002 | Joshi | |
| 6,509,582 B1 | 1/2003 | Bendall | |
| 6,521,982 B1 | 2/2003 | Crowley et al. | |
| 6,566,749 B1 | 5/2003 | Joshi et al. | |
| 6,580,165 B1 | 6/2003 | Singh | |
| 6,621,152 B2 | 9/2003 | Choi et al. | |
| 6,627,991 B1 | 9/2003 | Joshi | |
| 6,645,791 B2 | 11/2003 | Noquil et al. | |
| 6,646,329 B2 | 11/2003 | Estacio et al. | |

(Continued)

FOREIGN PATENT DOCUMENTS

JP 2000114445 A 4/2000

(Continued)

OTHER PUBLICATIONS

Office Action dated Feb. 1, 2011 to Japanese Patent Application No. 2008-541187 in English language, 4 pages.

*Primary Examiner* — James Mitchell
(74) *Attorney, Agent, or Firm* — Kilpatrick Townsend & Stockton LLP (57) ABSTRACT

A clip structure for a semiconductor package is disclosed. The clip structure includes a major portion, at least one pedestal extending from the major portion, a downset portion, and a lead portion. The downset portion is between the lead portion and the major portion. The clip structure can be used in a MLP (micro-leadframe package).

22 Claims, 10 Drawing Sheets

U.S. PATENT DOCUMENTS

| | | |
|---|---|---|
| 6,661,082 B1 | 12/2003 | Granada et al. |
| 6,674,157 B2 | 1/2004 | Lang |
| 6,683,375 B2 | 1/2004 | Joshi et al. |
| 6,696,321 B2 | 2/2004 | Joshi |
| 6,707,138 B2 | 3/2004 | Crowley et al. |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,762,067 B1* | 7/2004 | Quinones et al. ............... 438/11 |
| 6,774,465 B2 | 8/2004 | Lee et al. |
| 6,777,786 B2 | 8/2004 | Estacio |
| 6,777,800 B2 | 8/2004 | Madrid et al. |
| 6,798,044 B2 | 9/2004 | Joshi |
| 6,806,580 B2 | 10/2004 | Joshi et al. |
| 6,830,959 B2 | 12/2004 | Estacio |
| 6,836,023 B2 | 12/2004 | Joshi et al. |
| 6,849,930 B2* | 2/2005 | Nakajima et al. ............ 257/666 |
| 6,861,286 B2 | 3/2005 | Estacio et al. |
| 6,867,481 B2 | 3/2005 | Joshi et al. |
| 6,867,489 B1 | 3/2005 | Estacio |
| 6,870,254 B1 | 3/2005 | Estacio et al. |
| 6,873,041 B1* | 3/2005 | Crowley et al. ............... 257/692 |
| 6,890,793 B2 | 5/2005 | Singh |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,949,410 B2 | 9/2005 | Joshi et al. |
| 6,953,998 B2 | 10/2005 | Joshi et al. |
| 6,989,588 B2 | 1/2006 | Quinones et al. |
| 6,992,384 B2 | 1/2006 | Joshi |
| 7,052,938 B2 | 5/2006 | Estacio et al. |
| 7,071,033 B2 | 7/2006 | Estacio |
| 7,081,666 B2 | 7/2006 | Joshi et al. |
| 7,230,322 B2* | 6/2007 | Funato et al. ............... 257/666 |
| 7,504,281 B2 | 3/2009 | Joshi |
| 7,525,179 B2 | 4/2009 | Joshi et al. |
| 7,537,958 B1 | 5/2009 | Joshi |
| 7,560,311 B2 | 7/2009 | Cabahug et al. |
| 7,582,956 B2 | 9/2009 | Joshi et al. |
| 7,586,178 B2 | 9/2009 | Manatad |
| 2005/0212101 A1* | 9/2005 | Funato et al. ............... 257/666 |
| 2006/0076660 A1* | 4/2006 | Boschlin et al. ............ 257/678 |
| 2008/0197458 A1* | 8/2008 | Shi et al. ................... 257/666 |

FOREIGN PATENT DOCUMENTS

| | | |
|---|---|---|
| JP | 2001339028 A | 12/2001 |
| JP | 2005101293 A | 4/2005 |

\* cited by examiner

SEMICONDUCTOR DIE PACKAGE USING LEADFRAME AND CLIP AND METHOD OF MANUFACTURING

CROSS-REFERENCES TO RELATED APPLICATIONS

This application is a divisional of U.S. patent application Ser. No. 11/282,967, filed Nov. 18, 2005, entitled "Semiconductor Die Package Using Leadframe and Clip and Method of Manufacturing," which is herein incorporated by reference in its entirety for all purposes.

BACKGROUND OF THE INVENTION

Many semiconductor die packages use clips instead of wires to form external connections to external terminals. Such semiconductor die packages are sometimes referred to as "wireless" packages. A typical wireless package includes a clip that is attached to a semiconductor die. Wireless packages generally have better electrical and thermal performance than packages that use wire-based electrical connections.

Typically, conventional wireless packages need to be designed into a customers' circuit boards, because the circuit boards have unique footprints and pin assignments. It would be desirable to provide for a semiconductor die package that has a footprint and pin assignment that can correspond to conventional package footprints and pin assignments, while still having good electrical and thermal performance.

Also, when producing wireless packages, it is often difficult to create a clip (e.g., a source clip) that has a deep downset. The "downset" of a clip may correspond to the vertical distance between a major portion of the clip to the lead portion of the clip. It would also be desirable to provide for a clip that has a deeper downset than conventional clips so that different types of packages can be produced.

Another problem that exists is the problem of applying inconsistent or uneven amounts of solder between the clip and the semiconductor die. When inconsistent or uneven amounts of solder are used between a die and a clip, the resulting packages may exhibit poor performance.

In addition to the above-noted problems, it will be advantageous to provide for a method that can be used to create a semiconductor die package quickly and reliably. The method is also preferably compatible with Pb-free processing.

Embodiments of the invention address the above problems and other problems.

SUMMARY OF THE INVENTION

Embodiments of the invention are directed to clip structures, semiconductor die packages including the clip structures, and methods for making semiconductor die packages including clip structures.

One embodiment of the invention is directed to a clip structure for a semiconductor package, the clip structure comprising: a major portion; at least one pedestal extending from the major portion; a downset portion; and a lead portion, wherein the downset portion is between the lead portion and the major portion.

Another embodiment of the invention is directed to a clip structure for a semiconductor package, the clip structure comprising: a major portion; a downset portion having a stepped configuration; and a lead portion, wherein the downset portion is between the lead portion and the major portion.

Other embodiments of the invention are directed to semiconductor die packages including the above-described clip structures, as well as methods for making the semiconductor die packages using the clip structures.

Another embodiment of the invention is directed to a semiconductor die package comprising: a clip structure comprising a major portion, at least one pedestal extending from the major portion, a downset portion, and a lead portion, wherein the downset portion is between the lead portion and the major portion, and has a stepped configuration; a leadframe structure; and a semiconductor die, wherein the semiconductor die is between the leadframe structure and the clip structure.

Another embodiment of the invention is directed to method of manufacturing a semiconductor die package, the method comprising: obtaining a clip assembly; obtaining a leadframe structure comprising at least one alignment structure, wherein the alignment structure aligns the clip assembly to the leadframe structure during the assembly of a semiconductor die package; attaching a second surface of a semiconductor die to the leadframe structure; and attaching a first surface of the semiconductor die to the clip assembly.

These and other embodiments of the invention are described in further detail below.

DETAILED DESCRIPTION

Embodiments of the invention can include wireless packages. A wireless package according to an embodiment of the invention does not use wires to connect to input and/or output terminals of an electrical device in a semiconductor die. In other embodiments, the semiconductor die packages need not be wireless. For example, as illustrated below, embodiments of the invention include unique source clip structures with specific configurations. Such source clip structures could be used in a semiconductor die package with a gate wire bond. However, wireless semiconductor die packages are preferred as they generally have better thermal and electrical properties than semiconductor die packages that use wires for terminal connections.

In one semiconductor die package embodiment, the semiconductor die package comprises a clip structure comprising a major portion, at least one pedestal extending from the major portion, a downset portion, and a lead portion. The downset portion is between the lead portion and the major portion, and can have a stepped configuration. A semiconductor die is sandwiched between and is attached to the clip structure and a leadframe structure.

In embodiments of the invention, a first solder material can be used to mechanically and electrically couple the semiconductor die to the leadframe structure. A second solder material can be used to mechanically and electrically couple the semiconductor die to the clip structure. The first and second solder materials may be the same or different. They are preferably the same material and can comprise lead-free solder materials.

Figure 1:
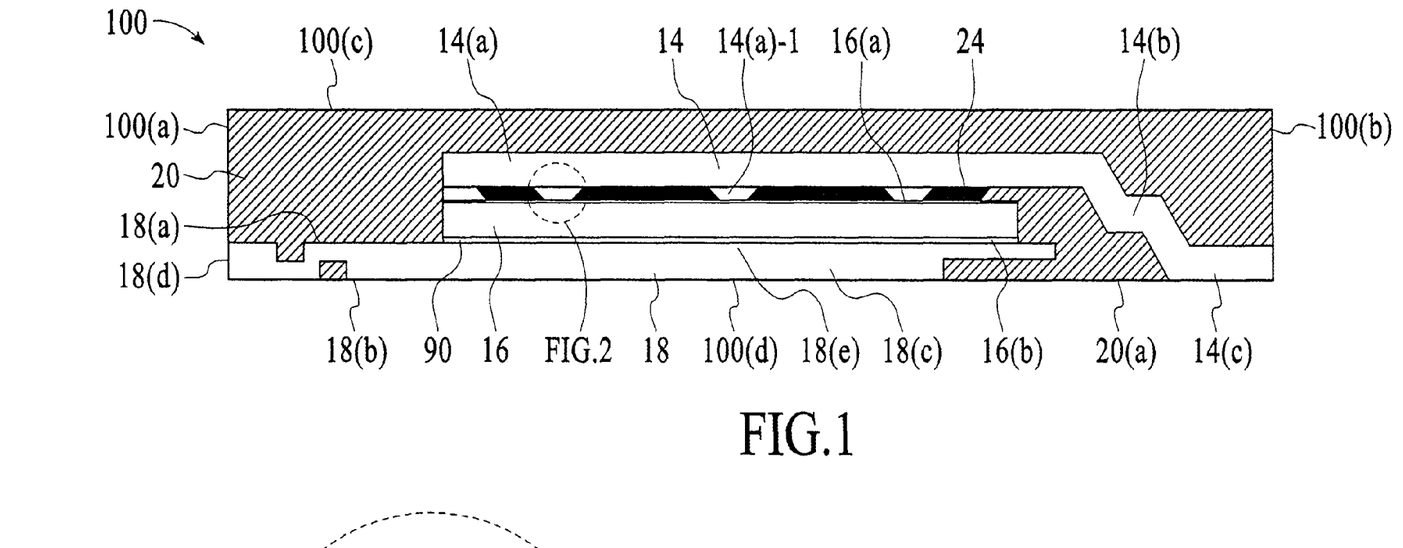
FIG. 1 shows a side cross sectional view of a die package according to an embodiment of the invention.

FIG. 1 shows a side cross-sectional view of a semiconductor die package according to an embodiment of the invention. The semiconductor die package 100 includes a semiconductor die 16, which is disposed between a source clip structure 14 and a leadframe structure 18. A molding material 20 at least partially covers the semiconductor die 16, the clip structure 14, and the leadframe structure 18. The molding material 20 may be an epoxy molding material or any other suitable commercially available molding material.

As shown in FIG. 1, the semiconductor die package 100 also includes a first lateral surface 100(a) and a second lateral surface 100(b), as well as a top surface 100(c) and a bottom surface 100(d).

Even though the resulting semiconductor die package 100 has embedded leads, the semiconductor die package 100 can be referred to as a "leadless" package in the sense that leads do not extend past the side surfaces of the molding material 20. It can also be in the form of a block, and the semiconductor die package 100 may also be referred to as a MLP (micro-leadframe package) type package in some embodiments. Although a leadless die package is described in detail in this application, it is understood that the clip structure 14 could alternatively be used in a leaded die package.

Solder 24 is between a first surface 16(a) of the semiconductor die 16 and the clip structure 14. Solder 90 is also present between a second surface 16(b) of the semiconductor die 16 and the leadframe structure 18.

Any suitable solder material may be used for solder 24 and solder 90. For example lead-tin solder could be used for solder 24 and solder 90. Preferably, the solder 24 and the solder 90 comprises a lead-free solder material such as indium-tin based solder. Alternatively, a conductive polymer adhesive (e.g., a conductive epoxy adhesive) could be used instead of solder.

The semiconductor die 16 may include any suitable semiconductor device. Suitable semiconductor devices may comprise a semiconductor material such as silicon, and may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. The semiconductor device in the semiconductor die 16 is preferably a vertical power transistor.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

In this example, the semiconductor die 16 comprises a vertical MOSFET. The vertical MOSFET includes a source region and a gate region at the first surface 16(a), and a drain region at the second surface 16(b) of the semiconductor die 16. The source region may have a source metal (e.g., a solderable top metal or solder bumps), and may be electrically coupled to the clip structure 14 (which may be a source clip structure). The gate region may be electrically coupled to a corresponding gate clip structure (not shown), while the drain region at the second surface 16(b) may be electrically coupled to the leadframe 18.

The leadframe structure 18 includes a first surface 18(a), and a second surface 18(b). The leadframe structure 18 also includes a portion 18(c) that is formed by an etching process, as well as a pad portion 18(e) and a lead portion 18(d). The pad portion 18(e) may form the DAP (die attach pad) of the leadframe structure 18.

As shown in FIG. 1, the lead portion 18(d) does not extend past the molding material 20, and is substantially coplanar with a bottom exterior surface 20(a) of the molding material 20. The first lateral surface 100(a) of the semiconductor die package 100 coincides with a side surface of the molding material 20 and a side surface of the lead portion 18(d). The bottom surface 100(d) of the semiconductor die package 100 coincides with a bottom surface of the leadframe structure 18 and a bottom exterior surface of the molding material 20.

The bottom of the leadframe structure 18 is exposed through the molding material 20. The exposed bottom surface of the leadframe structure 18 provides for an additional drain connection as well as an additional cooling path for the semiconductor die package 100.

The leadframe structure 18 may comprise any suitable material. For example, the leadframe structure 34 may comprise copper, copper alloys, or any other suitable conductive material. It may also be plated with a solderable metal if desired.

The clip structure 14 may have any suitable configuration. In this example, the clip structure 14 includes a major portion 14(a), a lead portion 14(c), and a downset portion 14(b). The downset portion 14(b) is disposed between the major portion 14(a) and the lead portion 14(c). It includes a stepped or zigzag structure. Although one "step" is shown in FIG. 1, in other embodiments, the clip structure 14 may include multiple steps.

The clip structure 14 may comprise any suitable material. For example, conductive materials such as copper, aluminum, and noble metals (and alloys thereof) may be used in the clip structure 14. The clip structure 14 may also be plated with solderable layers if desired.

The stepped downset portion 14(b) of the clip structure 14 provides for a number of advantages. For example, the stepped structure allows for a better alignment tolerance between a bottom surface of the lead portion 14(c) and a bottom surface of the leadframe structure 18. Since the downset portion 14(b) is bent, it can "flex" more than a non-stepped downset portion. This allows the lead portion 14(c) to be more easily aligned with the bottom surface of the leadframe structure 18. Also, the stepped downset portion 14(*b*) also allows the clip structure 14 to have a deeper downset than conventional clip structures.

In the clip structure 14, a number of discrete pedestals 14(*a*)-1 extend downward and perpendicular to the horizontal surface of the main portion 14(*a*) of the clip structure 14. A pedestal 14(*a*)-1 is more clearly shown in FIG. 2. As shown, the end of the pedestal 14(*a*)-1 can contact the first surface 16(*a*) of the semiconductor die 16, and solder 24 surrounds the pedestal. The surface of the clip structure 14 opposite the pedestal 14(*a*)-1 is somewhat concave. This concave structure and the corresponding pedestal 14(*a*)-1 can be formed by a process such as stamping. Although a stamping process is described, the pedestals according to embodiments of the invention can be formed by any other suitable method known to those of ordinary skill in the art. For example, pedestals could be formed on a planar clip structure by etching the clip structure so that the appropriate protrusions are formed. Alternatively, protrusions can be formed by plating or placing conductive columns on a flat surface of a clip structure.

Figure 2:
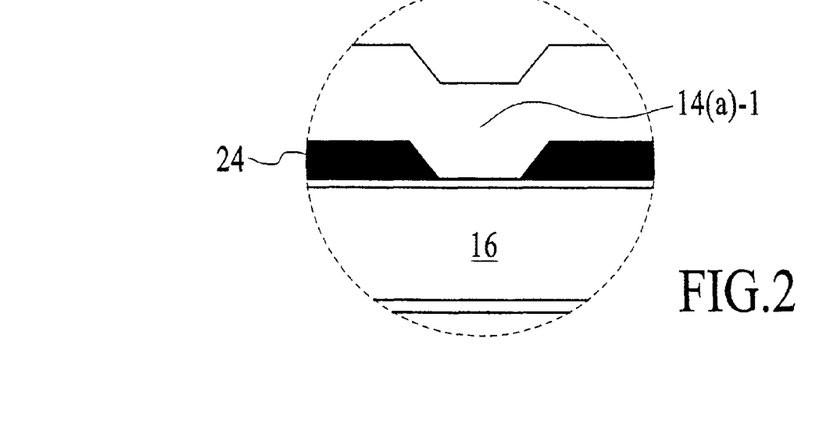
FIG. 2 shows a side cross sectional view of a pedestal in a clip structure according to an embodiment of the invention.

The pedestals 14(*a*)-1 in the clip structure 14 provide for a number of advantages. For example, they provide for consistent spacing between the bottom surface of the major portion 14(*a*) of the source clip structure 14 and the first surface 16(*a*) of the semiconductor die 16. Because there is a consistent spacing between the major portion 14(*a*) of the clip structure 14 and the first surface 16(*a*) of the semiconductor die, a consistent amount of solder is always present between them. Excess solder, if any, can squeeze out from between the clip structure 14 and the semiconductor die 16. In addition to providing for the more consistent solder deposition, the pedestals 14(*a*)-1 also provide for a larger attachment surface area for the clip structure 14, thereby providing for a better bond and better electrical connection between the source clip structure 14 and the semiconductor die 16. The pedestals 14(*a*)-1 also prevent the clip structure 14 from undesired "tilting". If the pedestals 14(*a*)-1 were not present, the clip could "tilt", thereby resulting in the uneven application of solder to the top surface of the semiconductor die 16.

Figure 3:
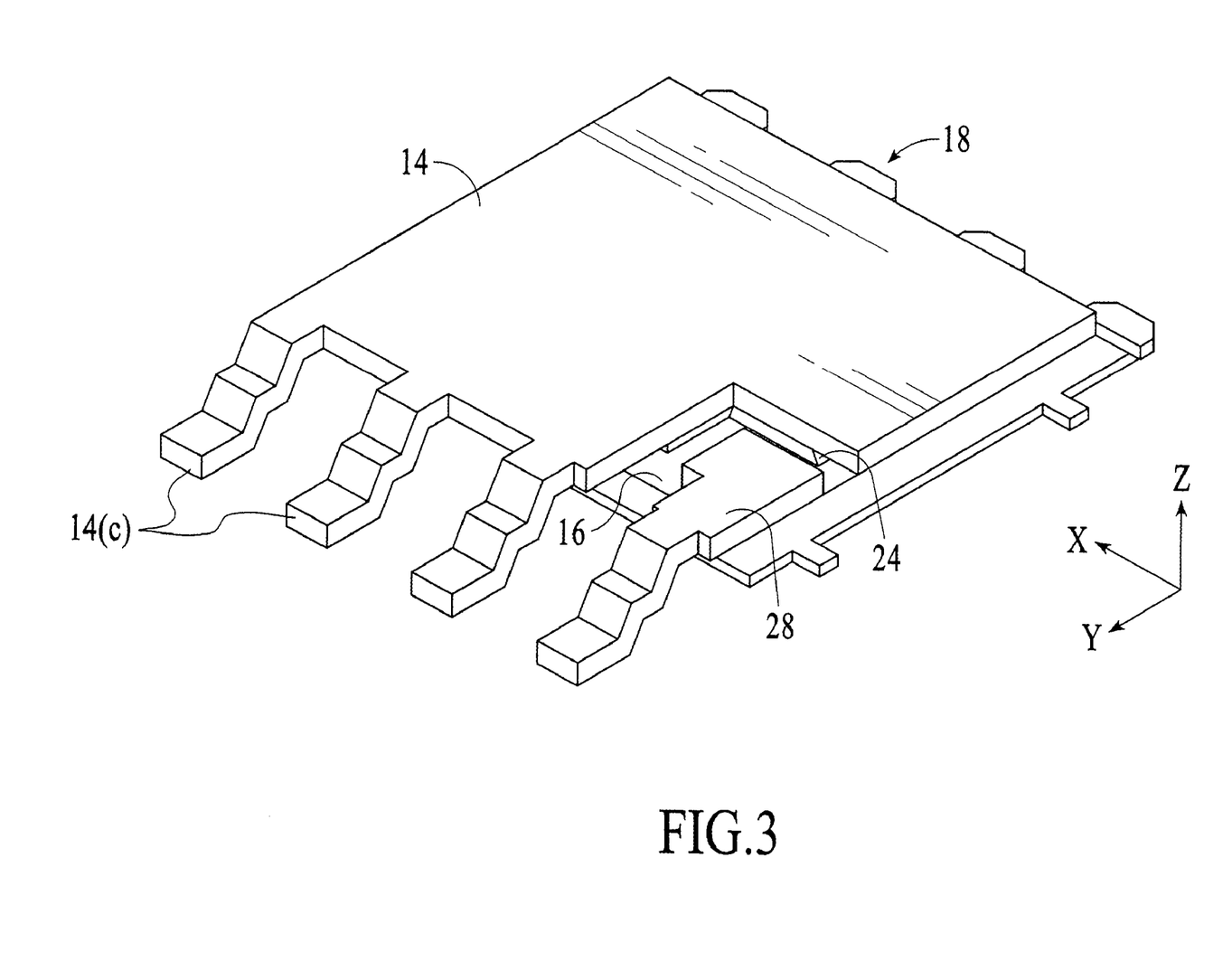
FIG. 3 shows a perspective view of a semiconductor die package according to an embodiment of the invention.

FIG. 3 shows a perspective view of a semiconductor die package according to an embodiment of the invention. In this illustration, the molding material is not shown. As shown in FIG. 3, the semiconductor die package may include a source clip structure 14 and a gate clip structure 28. The gate clip structure 28 and the source clip structure 14 are electrically uncoupled from each other. As will be explained in greater detail below, the source clip structure 14 and the gate clip structure 28 may be derived from a clip assembly. In FIG. 3, as in FIG. 1, the semiconductor die 16 is sandwiched between the source clip structure 14 and the leadframe structure 18. Also, as shown in FIG. 3, the semiconductor die 16 is also sandwiched between the gate clip structure 28 and the leadframe structure 18. Like the source clip structure 14, the gate clip structure 28 may also include one or more pedestals (not shown) to provide for consistent solder deposition.

Figure 4:
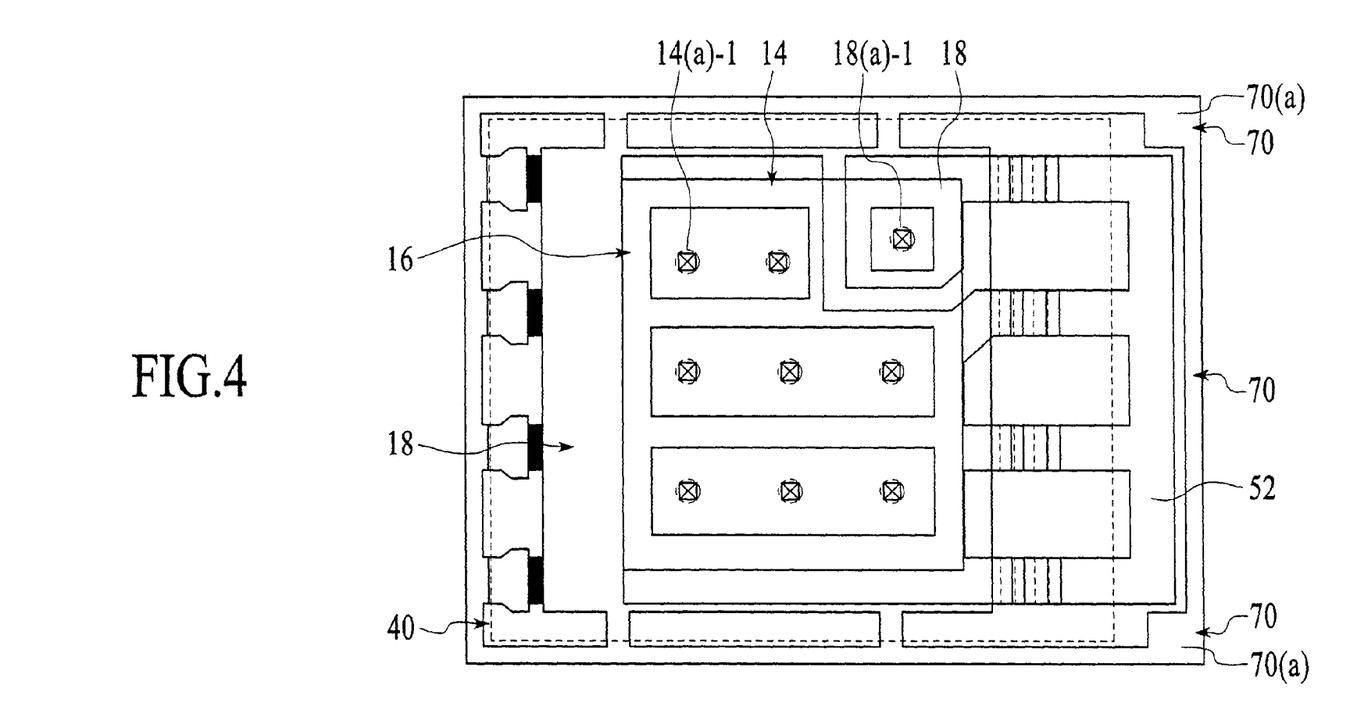
FIG. 4 is a top schematic view of a semiconductor die package according to an embodiment of the invention.

FIG. 4 shows a top view of a semiconductor die package in a package assembly. The dotted line indicated by reference number 40 shows where the assembly will be cut with a saw or the like. Prior to being cut, the gate clip structure 18 and the source clip structure 14 are joined by a bridge structure 52. The bridge structure 52 electrically and mechanically connects the leads of the gate clip structure 18 and the source clip structure 14. In addition, prior to being cut, the leadframe structure 18 is part of a leadframe assembly that includes an alignment rail structure 70. The alignment rail structure 70 includes two alignment end structures 70(*a*). In this example, the alignment end structures 70(*a*) are in the form of metal squares, but could have other shapes in other embodiments of the invention. The alignment end structures 70(*a*) confine the bridge structure 52 so that the clip assembly 102 is properly aligned with the terminals of the semiconductor die 16. Specifically, the source clip structure 14 and the source clip structure pedestals 14(*a*)-1 are automatically aligned so that they are electrically coupled to the source terminals in the MOSFET in the semiconductor die 16. At the same time, the gate clip structure 18 and the gate pedestal 18(*a*)-1 are automatically aligned so that they are electrically coupled to the gate terminal in the MOSFET in the semiconductor die 16. This alignment process takes one step, thereby saving processing time and cost.

Once the clip assembly 102 and the leadframe structure 18 are attached to the semiconductor die 16 using solder, the resulting assembly can be subjected to a reflow process to reflow all of the solder in the package simultaneously. A molding material can then be formed around the die in an encapsulation process. Then, the assembly can be cut along the dotted line shown by reference number 40. This separates the bridge structure 52 from the formed package and electrically uncouples the gate lead structure 18 and the source lead structure 16. Since only one reflow process is needed to form the resulting package, the package can be formed quickly and efficiently. Also, performing only one reflow process decreases the chances of forming intermetallic compounds in the solder. Intermetallic compounds are more likely to be formed with repeated heating. Intermetallic compounds can also lead to brittle solder joints and an increase the likelihood of defective solder joints.

Figure 5:
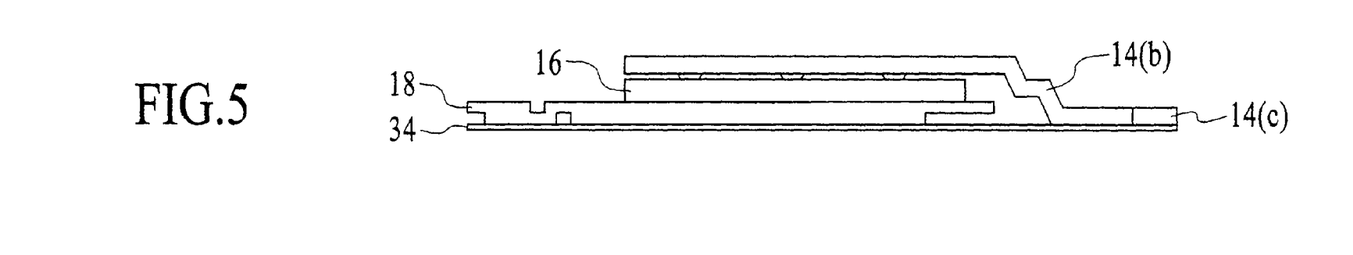
FIG. 5 is a side view of a semiconductor die package according to an embodiment of the invention.

FIG. 5 shows the assembly in FIG. 4 from a side view. As shown in FIG. 5, the leadframe structure 18 and the lead portion 14(*c*) are coplanar with each other and are disposed on a temporary substrate 34. The temporary substrate 34, can be made of any suitable material. For example, the temporary substrate 34 could be made of tape. After the package is formed, the temporary substrate 34 may be removed.

Figure 6:
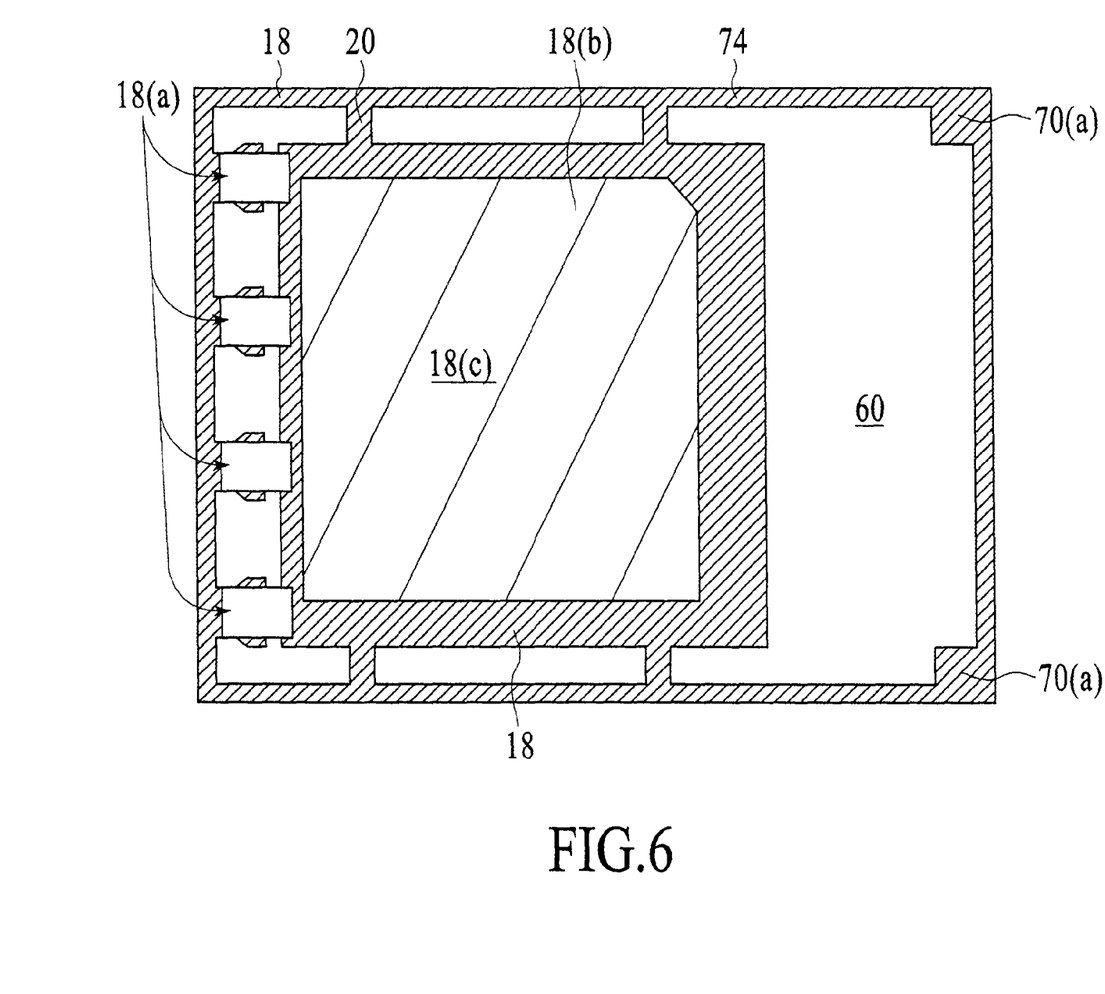
FIG. 6 shows a bottom view of a leadframe structure according to an embodiment of the invention.

FIG. 6 shows a bottom view of a leadframe assembly according to an embodiment of the invention. The leadframe assembly includes a leadframe structure 18, which includes a number of the drain leads 18(*a*), and an etched portion 18(*c*). The etched portion 18(*c*) may form a drain pad 18(*b*) for the semiconductor die package and may be eventually soldered to a circuit board (not shown). Connection rails 20 may connect the leadframe structure 18 to a frame 74. The frame 74 may include the previously described rail structure 70 and alignment end structures 70(*a*), and may define a hole 60. The leads of the source clip structure (not shown) may be present in the hole 60 during package assembly.

Figure 7:
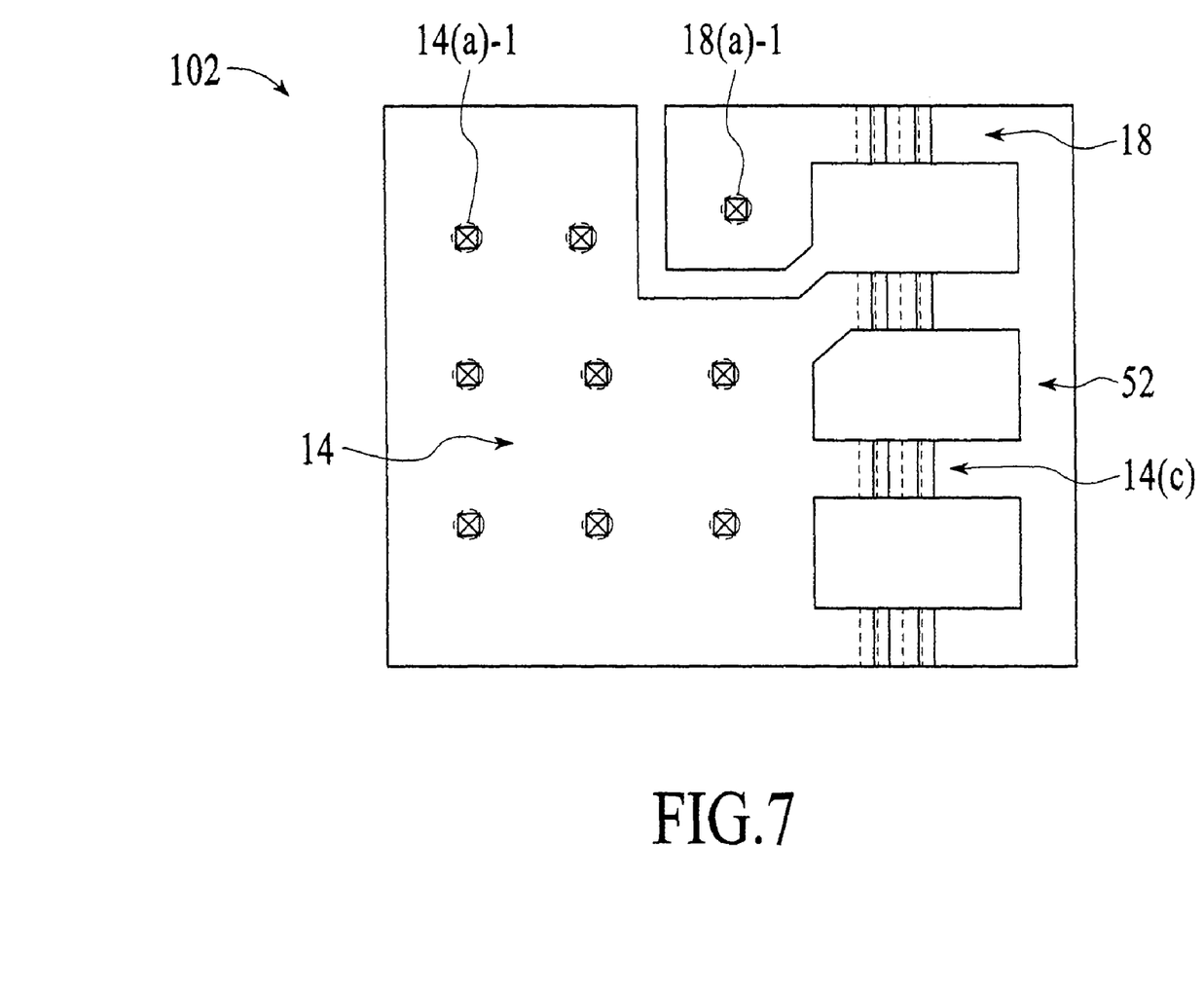
FIG. 7 shows a top plan view of a clip assembly according to an embodiment of the invention.

FIG. 7 shows a clip assembly 102 before it is cut. As showed in FIG. 7, a bridge structure 52 couples the leads of the source clip structure 14 and the lead of the gate clip structure 18. As explained above, the bridge structure 52 is separated from the gate clip structure 18 and the source clip structure 14, and they are electrically uncoupled from each other in the formed semiconductor die package. The other elements in FIG. 7 have been previously described.

Figure 8:
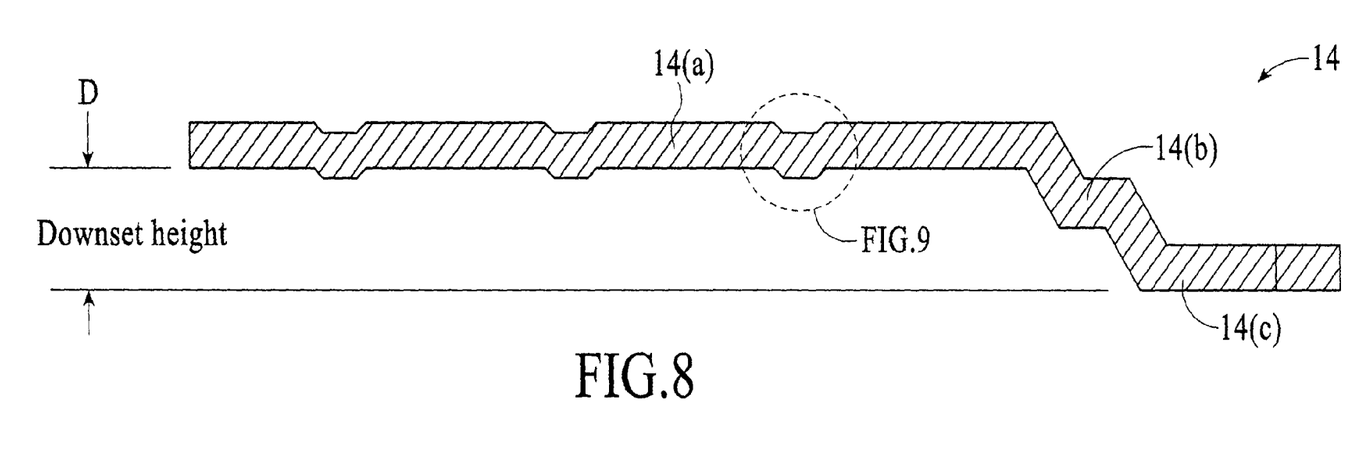
FIG. 8 shows a side cross sectional view of a clip structure according to an embodiment of the invention.

FIG. 8 shows a side view of a clip structure 14 according to an embodiment of the invention. As shown in FIG. 8, the pedestal 14(*a*)-1 resembles a mesa structure. However, in other embodiments, the pedestals may be cone-shaped, cylinder-shaped, or may have any other protruding shape. Also, the downset height between a bottom surface of the major portion 14(*a*) and the bottom surface of the lead portion 14(*c*) may be designated by the height D. In preferred embodiments, the downset height may be about 2 times the thickness (or more) of the leadframe structure 18 or the thickness of the clip structure 14. The thickness of the leadframe structure 18 and/or the clip structure 14 can be greater than about 100 microns in some embodiments.

Figure 9:
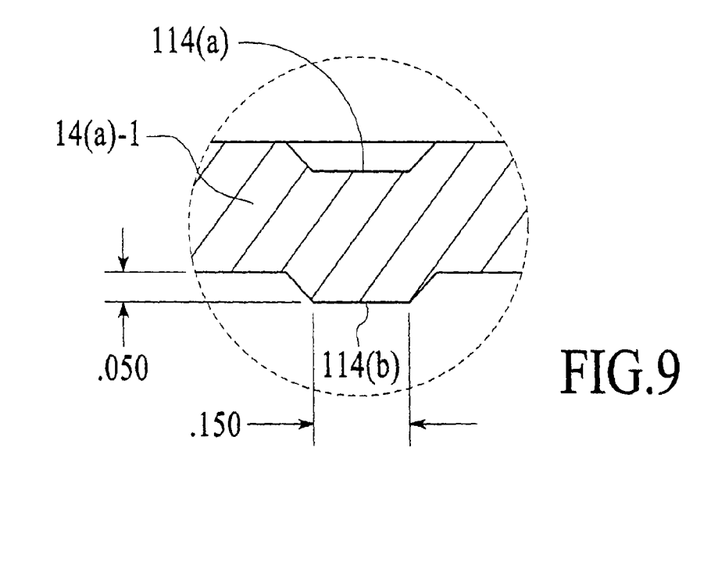
FIG. 9 shows a side cross sectional view of a pedestal according to an embodiment of the invention.

As shown in FIG. 9, the height of the pedestal 14(*a*)-1 may be about 50 microns, while the width of the pedestal may be approximately 150 microns. Of course, the dimensions of other pedestal may be different in other embodiments of the invention.

Figure 10:
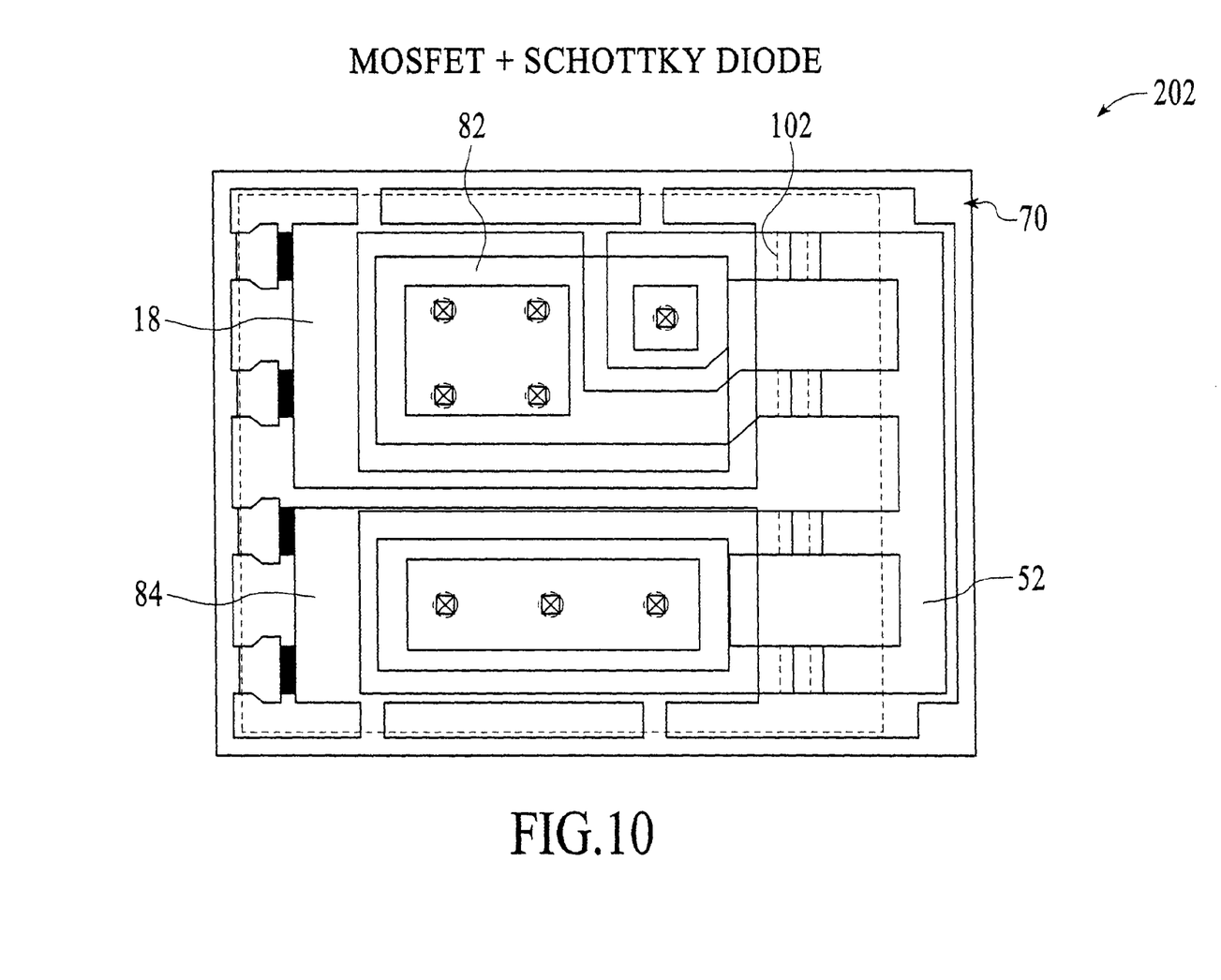
FIG. 10 shows a top schematic view of a semiconductor die package including a MOSFET die and a Schottky diode die.

FIG. 10 shows a semiconductor die package 202 that includes a MOSFET die 82 and a Schottky diode die 84. A clip assembly 102 may include terminal connections to source and gate connections in the MOSFET die 82 and an input and/or output to the Schottky diode die 84. As in prior embodiments, the clip assembly 102 may include a bridge structure 52, which is aligned between alignment structures 70(*a*).

Figure 11:
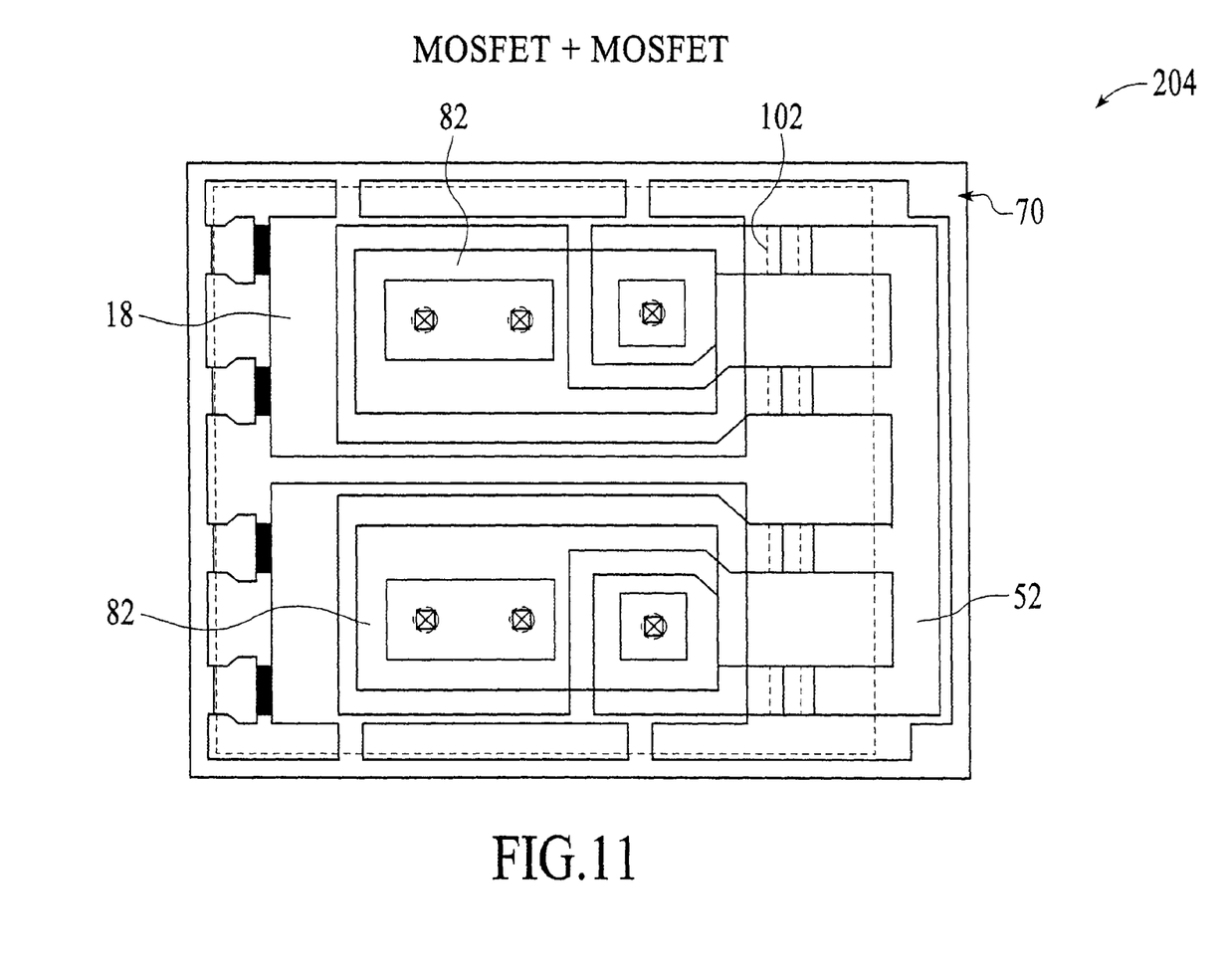
FIG. 11 shows a top schematic view of a semiconductor die package including two MOSFET dies.

FIG. 11 shows a semiconductor die package 204 that includes two MOSFET dies 82. A clip assembly 102 may include terminal connections to source and gate connections in the MOSFET dies 82. As in prior embodiments, the clip assembly 102 may include a bridge structure 52, which is aligned between alignment structures 70(*a*).

Figure 12:
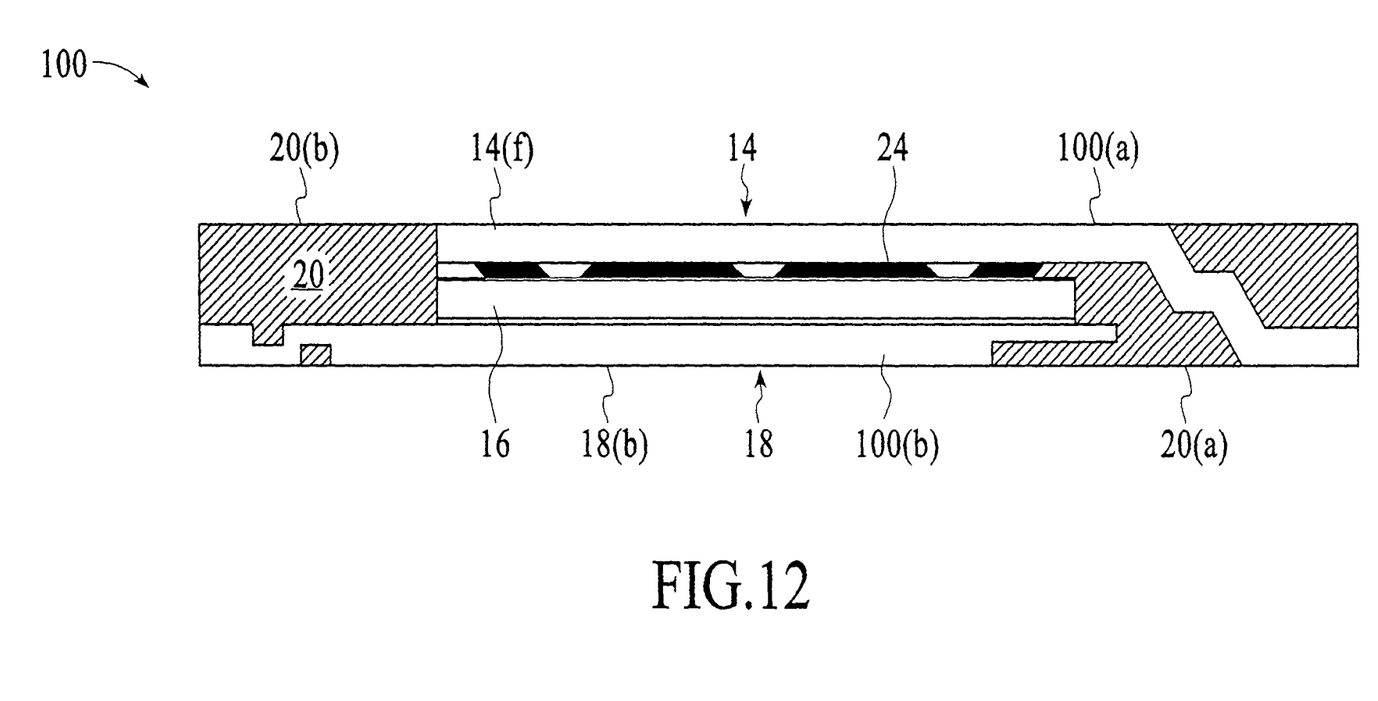
FIG. 12 shows a semiconductor die package according to another embodiment of the invention. In this embodiment, surfaces of both the clip structure and the leadframe structure are exposed through a molding material.

FIG. 12 shows a semiconductor die package according to another embodiment of the invention. This embodiment is similar to the embodiment shown in FIG. 1, except that the molding material 20 at the top portion of the package exposes the upper surface of the clip structure 14. If desired, a heat sink (not shown) may be attached to the top surface 14(*f*) of the clip structure 14. The exposed clip structure surface 14(*f*) is substantially coplanar with an exterior surface 20(*b*) of the molding material 20. The exposed clip surface 14(*f*) allows for better heat dissipation and also results in a thinner semiconductor die package. The exposed clip surface 14(*f*) can be formed by covering the surface with tape or a molding die, or any other suitable method known to one skilled in the art, and then molding the molding material 20 around the semiconductor die 16. The other features in FIG. 12 have been previously described.

FIGS. 13(*a*)-13(*d*) show how semiconductor die packages according to embodiments of the invention can be assembled.

FIG. 13(*a*) shows semiconductor dies 16 being mounted on leadframe structures 34. The leadframe structure 34 may be in array or "gang" of leadframe structures. The gang may be a 2 or 1-dimensional array of leadframe structures connected together by rails or the like. As previously described, solder (e.g., lead-free solder) may be used to attach the semiconductor dies 16 to the leadframe structures 18. At this point in the process, the leadframe structures 18 may be disposed on a temporary substrate 34 such as tape. This is done to cover the bottom surface of the leadframe structure 18 so that it is not covered with a molding material. At this point, the solder that is used to attach the leadframe structures 18 to the semiconductor dies 16 has not yet been reflowed.

FIG. 13(*b*) shows clip structures 14 being placed on the semiconductor dies 16. The downset portions of the clip structures 14 are not shown as being stepped. However, it is understood that, in other embodiments, clip structures 14 with stepped downset portions may be used. As in other embodiments, the clip structures 14 may have pedestals 14(*a*)-1 that space major portions of the clip structures 14 from the top surfaces of the semiconductor dies 16.

Figure 13A:
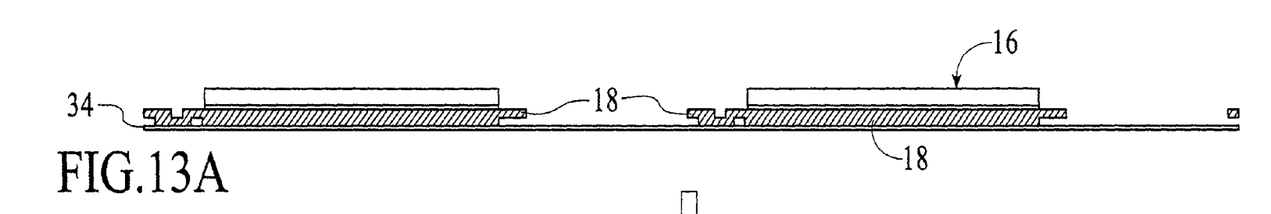
FIGS. 13(a) to 13(d) show side cross sectional views of structures as they all are being assembled into semiconductor die packages.
Figure 13B:
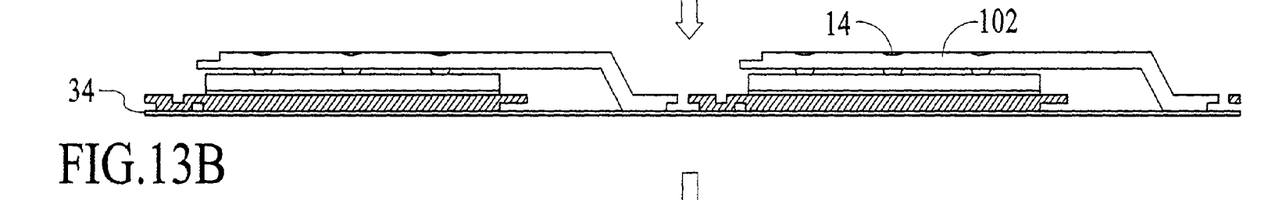
Figure 13C:
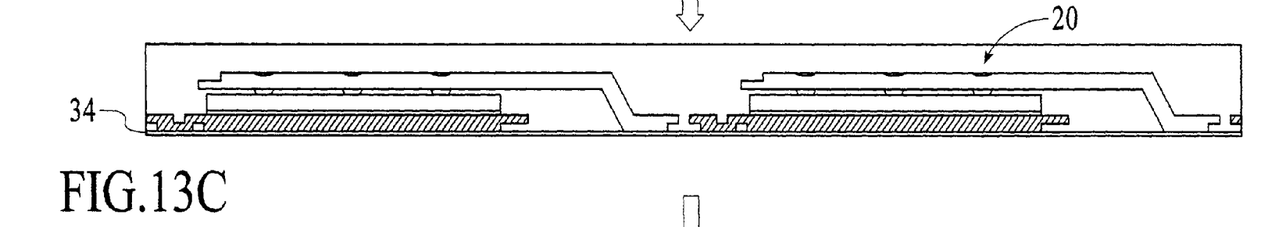
Figure 13D:
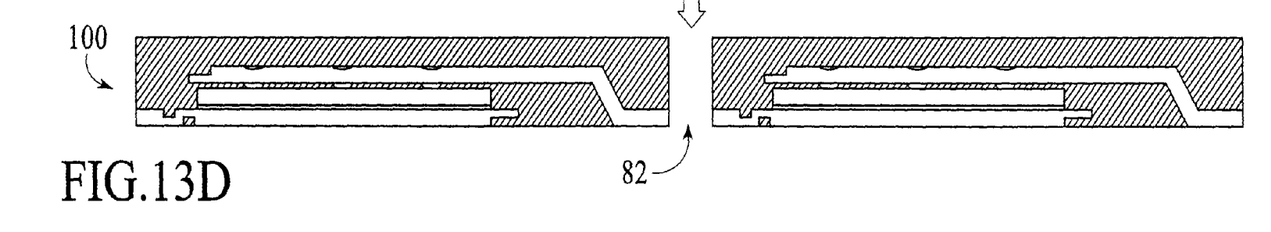

In some embodiments, solder may be deposited on the top surfaces of the semiconductor dies 16 and the clip structures 14 may be mounted thereon. Alternatively or additionally, solder may be deposited on the clip structures 14 and the solder-coated clip structures may be attached to the top surfaces of the semiconductor dies 16.

As noted above, the solder material that is used to attach the semiconductor dies 16 to the leadframe structures 18 may be the same or different than the solder material that is used to attach the clip structures 14 to the semiconductor dies 16. After the clip structures 14 are attached to the semiconductor dies 16, the solder materials that are used to attach these components together are simultaneously reflowed. Suitable reflow processing conditions are known to those of ordinary skill in the art.

FIG. 13(*c*) shows the assembly after a molding process is performed. Commercially available molding tools may be used to perform the molding process. Molding materials such as epoxy molding materials may be used.

FIG. 13(*d*) shows the process of singulation. In a singulation process, semiconductor die packages 100 that are joined together are separated from each other. Any suitable cutting tool may be used for this purpose. For example, a water jet, laser, saw, etc. may be used to separate the semiconductor die packages from each other.

Embodiments of the invention provide for a number of advantages. For example, embodiments of the invention can have the same footprint and pin assignment as other types of conventional packages, while also exhibiting good electrical and thermal performance. In addition, the methods according to embodiments of the invention may use alignment structures to align clip structures on top of a semiconductor die with a leadframe structure at the bottom of the semiconductor die. This results in more efficient processing, and flip chip attachment processes need not be performed in embodiments of the invention. Also, embodiments of the invention are robust. In some embodiments, the semiconductor dies are not exposed to the environment.

Also, in embodiments of the invention, the same type of solder paste or conductive adhesive can be used to attach the leadframe structure to the bottom surface of the semiconductor die, and one or more clip structures to the top surface of the semiconductor die. A one-time solder-paste reflow process may be performed for both die attach and clip attach. Because only one reflow process is needed in this example, the formation of excessive amounts of intermetallic compounds in the solder joints is minimized or prevented. Also, because only one reflow process needs to be performed in this example, two types of Pb-free solder with different melting points are not needed.

In conventional processing, the die is attached to a leadframe structure using solder and that solder is reflowed. Then, a clip structure is attached to the semiconductor die and is also reflowed. The solder between the die and the leadframe structure is subjected to two heating processes. This increase in heating increases the chances that intermetallic compounds may form.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents. Moreover, any one or more features of one or more embodiments may be combined with one or more features of any other embodiment without departing from the scope of the invention. For example, the features in the embodiments in FIGS. 10 and 11 can be combined with the features of any other embodiment in any other figure without departing from the scope of the invention.

Any reference to positions such as "top", "bottom", "upper", "lower", etc. refer to the Figures and are used for convenience. They are not intended to refer to absolute positions. For example, although FIG. 1 shows a "bottom" surface of a semiconductor die package, it is understood that the semiconductor die package could be mounted sideways, upside-down, or right side up and would still be within the scope of the claims.

A recitation of "a", "an" or "the" is intended to mean "one or more" unless specifically indicated to the contrary.

All patents, patent applications, publications, and descriptions mentioned above are herein incorporated by reference in their entirety for all purposes. None is admitted to be prior art.

What is claimed is:

1. A method for forming a semiconductor die package, the method comprising:
    obtaining a clip structure comprising a major portion, a plurality of pedestals each extending from the major portion, a single concave surface opposite each said pedestal, wherein each said pedestal comprises a single pedestal, a downset portion, and a lead portion, wherein the downset portion is between the lead portion and the major portion, wherein the concave surface and each said pedestal are formed by stamping;
    obtaining a semiconductor die; and
    attaching the clip structure to the semiconductor die wherein the plurality of pedestals faces the semiconductor die.

2. The method of claim 1 further comprising:
    attaching the semiconductor die to a leadframe structure; and
    molding a molding material around the semiconductor die.

3. The method of claim 2 wherein the semiconductor die package is formed after molding, and wherein the semiconductor die package is a leadless package.

4. The method of claim 1 wherein the downset portion includes a stepped configuration.

5. The method of claim 4 wherein the semiconductor die comprises a MOSFET comprising a trenched gate structure.

6. The method of claim 4 wherein the semiconductor die is a first semiconductor die, and the clip structure is a first clip structure, and wherein the method further comprises attaching a second clip structure to a second semiconductor die, and then molding a molding material around the first semiconductor die and the second semiconductor die.

7. The method of claim 4 wherein the semiconductor die is a first semiconductor die comprising a MOSFET, and the clip structure is a first clip structure, and wherein the method further comprises attaching a second clip structure to a second semiconductor die comprising a Schottky diode, and then molding a molding material around the first semiconductor die and the second semiconductor die.

8. The method of claim 4 comprising:
    attaching the semiconductor die to a leadframe structure; and
    molding a molding material around the semiconductor die.

9. The method of claim 8 wherein the semiconductor die package is formed after molding, and wherein the semiconductor die package is a leadless package.

10. The method of claim 8 wherein a thickness of the leadframe structure is greater than about 100 microns.

11. The method of claim 10 wherein a thickness of the clip structure is greater than about 100 microns.

12. The method of claim 1 wherein the pedestals are cone shaped.

13. A method of manufacturing a semiconductor die package, the method comprising:
    obtaining a clip assembly comprising a clip structure comprising a major portion, a plurality of pedestals wherein each said pedestal comprises a single pedestal extending from the major portion, a single concave surface opposite the single pedestal, a downset portion, and a lead portion, wherein the downset portion is between the lead portion and the major portion, wherein the concave surface and the single pedestal are formed by stamping;
    obtaining a leadframe structure associated with at least one alignment structure, wherein the alignment structure aligns the clip assembly to the leadframe structure during the assembly of a semiconductor die package;
    attaching a second surface of a semiconductor die to the leadframe structure; and
    attaching a first surface of the semiconductor die to the clip assembly, wherein the semiconductor die is a first semiconductor die, and the clip structure is a first clip structure, and wherein the method further comprises attaching a second clip structure to a second semiconductor die, and then molding a molding material around the first semiconductor die and the second semiconductor die.

14. The method of claim 13 wherein the clip assembly and the leadframe structure are present in gangs of leadframe structures and clip assemblies.

15. The method of claim 13 wherein the leadframe structure comprises two alignment structures and wherein a rail of the clip assembly is between the two alignment structures.

16. The method of claim 14 wherein the clip assembly and the leadframe structure comprise copper.

17. The method of claim 14 wherein the first semiconductor die comprises a vertical power MOSFET.

18. The method of claim 13 wherein the attaching the second surface of the first semiconductor die to the leadframe structure comprises using a first solder material and attaching the clip assembly to the first surface of the first semiconductor die comprises using a second solder material, and wherein the method further comprises:
    reflowing the first and second solder materials in a single reflow process.

19. The method of claim 13 further comprising:
    separating the alignment structure from the leadframe structure.

20. The method of claim 1 wherein the first semiconductor die comprises a trenched gate structure.

21. The method of claim 13 wherein the first semiconductor die comprises a trenched gate structure.

22. The method of claim 13 wherein the first semiconductor die comprises a MOSFET, and the second semiconductor die comprises a Schottky diode.

* * * * *

UNITED STATES PATENT AND TRADEMARK OFFICE
CERTIFICATE OF CORRECTION

| | | |
|---|---|---|
| PATENT NO. | : 8,058,107 B2 | Page 1 of 1 |
| APPLICATION NO. | : 11/856635 | |
| DATED | : November 15, 2011 | |
| INVENTOR(S) | : Erwin Victor Cruz et al. | |

It is certified that error appears in the above-identified patent and that said Letters Patent is hereby corrected as shown below:

On the Title page:
In the Assignee data (73), please insert the assignee as follows:

--Fairchild Semiconductor Corporation, South Portland, ME (US)--

Signed and Sealed this
Twenty-fourth Day of April, 2012

David J. Kappos
*Director of the United States Patent and Trademark Office*